United States Patent [19]

Krishna et al.

[11] Patent Number: 4,581,626
[45] Date of Patent: Apr. 8, 1986

[54] THYRISTOR CATHODE AND TRANSISTOR EMITTER STRUCTURES WITH INSULATOR ISLANDS

[75] Inventors: Surinder Krishna, Schenectady; E. Duane Wolley, Auburn, both of N.Y.

[73] Assignee: General Electric Company, Schenectady, N.Y.

[21] Appl. No.: 28,576

[22] Filed: Apr. 9, 1979

Related U.S. Application Data

[63] Continuation of Ser. No. 844,658, Oct. 25, 1977, abandoned.

[51] Int. Cl.$^4$ .............................................. H01L 29/74
[52] U.S. Cl. ........................................ 357/38; 357/20; 357/36
[58] Field of Search .............................. 357/20, 36, 38

[56] References Cited

U.S. PATENT DOCUMENTS

| | | | |
|---|---|---|---|
| 3,430,115 | 2/1969 | Webb | 357/36 |
| 3,432,920 | 3/1969 | Rosenzweig | 357/36 |
| 3,619,738 | 11/1971 | Otsuka | 357/38 |
| 3,902,188 | 8/1975 | Jacobson | 357/20 |

OTHER PUBLICATIONS

J. Gillett, "Power Transistor Having Increased Reverse Bias Safe Operating Area," *IBM Tech. Discl. Bull.*, vol. 16, #11, Apr. 1974, p. 3642.

*Primary Examiner*—Joseph E. Clawson, Jr.
*Attorney, Agent, or Firm*—Marvin Snyder; James C. Davis, Jr.

[57] ABSTRACT

A gate turn-off (IGTO) thyristor having short turn-off times and high di/dt and dV/dt capabilities comprises an insulating layer overlying the inner region of the n2-emitter (cathode) region which includes a central region of greater resistivity than the n2-emitter cathode region for reducing turn-off current density of the device. The addition of an insulating layer and a central region of increased resistivity to the central portions of a base region of a bipolar transistor provides similar improved performance characteristics.

1 Claim, 6 Drawing Figures

THYRISTOR CATHODE AND TRANSISTOR EMITTER STRUCTURES WITH INSULATOR ISLANDS

This is a continuation of application Ser. No. 844,658 filed Oct. 25, 1977 abandoned.

The present invention relates to semiconductor devices such as gate turn-off thyristors and insulated base bipolar transistors and more particularly to improved gate and base structures to provide reduced turn-off current density and turn-off time.

The gate turn-off silicon rectifier is a four-layer semiconductor device similar to the ordinary thyristor in that it is triggered into conduction by a gate current pulse applied to the gate electrode. Unlike the ordinary thyristor, however, a gate turn-off thyristor is turned off by an opposite polarity current pulse applied to the gate electrode, thus eliminating the need for special commutation components that add to the space requirements, cost and complexity of ordinary thyristor circuits. The gate turn-off thyristor, which is also known as a GTO switch, or GTO-SCR, turns off the anode current by a reverse gate pulse which withdraws current from the gate lead. Due to the regenerative nature of the GTO device, rather large reverse gate pulses are required, particularly for the high power devices presently being developed. Typically, a reverse gate current with a magnitude equal to at least 10 to 50% of the anode current is needed to obtain reliable turn-off. In practice, it is common to supply a preselected gate pulse of sufficiently high magnitude to turn off the largest GTO anode current expected.

Typically, upon application of a reverse gate current to effect turn-off of a GTO, current flowing between the anode and cathode is "squeezed" toward the central portion of the device. More specifically, upon application of the turn-off signal to the gate region, the regions of the semiconductor device immediately adjacent to the gate region are first to become nonconducting and cause the current to be forced or squeezed toward the center of the device. As turn-off continues, the current density increases at, or near the center of the emitter (or cathode). When the conducting region is squeezed to a sufficiently small enough dimension, the device turns off in a one-dimensional manner as the regenerative processes are interrupted. In the event that the turn-off current applied to the gate electrode is of insufficient magnitude to cause turn-off, the conducting area of the device has been extremely localized and can cause a failure to occur either by excessive heat generated or by avalanche injection effects.

One prior art approach to minimizing current densification at the cathode during turn-off has been to introduce cathode-gate "shorts". Such cathode-gate shorts reduce the cathode current density and enhance the di/dt capability of the device, as well as reduce the turn-off time of the device. Unfortunately, the cathode-gate shorts require a steady current flow from cathode to gate during the reverse biased period, i.e., when the GTO is turned off. Depending upon the number of cathode-gate shorts, this current can be a significant fraction of the ON current and hence represents a power loss and undesirable heat generation in the device itself.

Conventional bipolar transistors structured in either a highly interdigitated manner for high current, low voltage applications, or less interdigitated with greater geometrical emitter areas for high current, high voltage, applications are similarly vulnerable to the current squeezing phenomena discussed above with respect to thyristors. This failure mechanism is also referred to as second breakdown and is discussed more thoroughly by S. Krishna and P. L. Hower in the Proceedings of the I.E.E.E., Vol. 61, March 1963, entitled "Second Breakdown of Transistors During Inductive Turnoff".

Accordingly, it is an object of this invention to provide high power controlled turn-on and turn-off solid state switches, such as the gate turn-off thyristor and the bipolar transistor, with improved cathode and emitter structures, respectively, which reduce the current densification during turn-off, reduce the turn-off time and increase the threshold for failure to second breakdown either by avalanche injection or heat generation.

It is a further object of this invention to provide improved gate turn-off thyristors and bipolar transistors which exhibit no significant drain current from cathode to gate or base to emitter during the reverse biased turn-off period.

It is still a further object of this invention to provide gate turn-off thyristors with improved di/dt and dV/dt characteristics.

In accordance with the present invention, these and other objects are achieved in accordance with an improved cathode or emitter configuration in which current densification during turn-off is substantially reduced by increasing the area through which current may flow during the turn-off period. In accordance with one embodiment of the invention, the central region of the emitter (or cathode) of a GTO is prevented from conducting substantial current by interposing, in the central region, a region of greater resistivity than that of the emitter (or cathode) and thereover, an insulating layer of silicon dioxide. The central region of high impedance substantially reduces current densification and hence increases the threshold for failure to second breakdown. A similar structured configuration may be employed for improving the turn-off characteristics of a bipolar transistor, e.g., by substantially eliminating the emitter-base leakage current during turn-off of the bipolar transistor. In addition, the current gain characteristic of the bipolar transistor is unaffected by the improved emitter structure.

The foregoing and other objects, features and advantages of the invention will be appreciated from the following description of several preferred embodiments of the invention, as illustrated in the accompanying drawings wherein.

Figure 1:
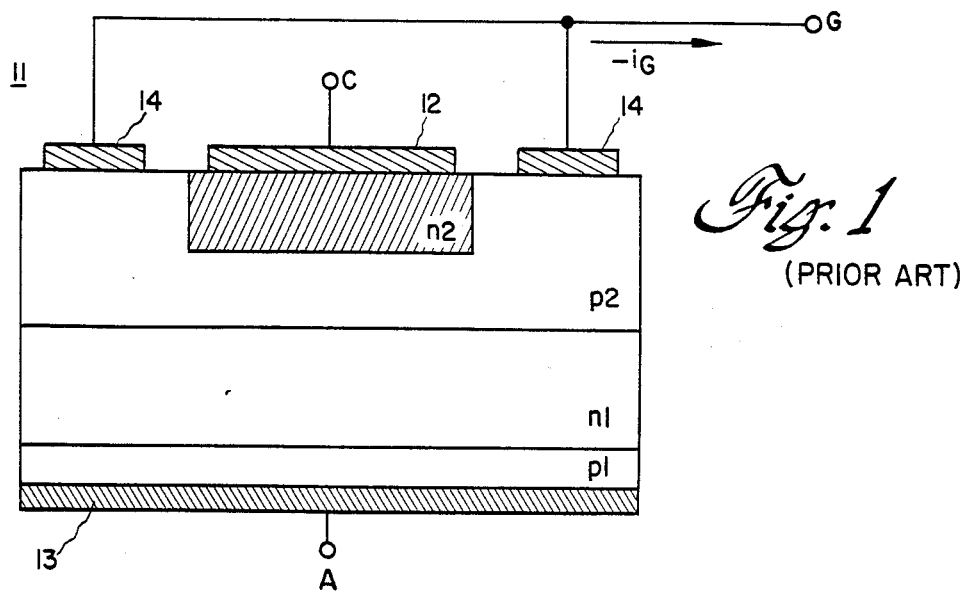
FIGS. 1 and 2 are diagrammatic, cross-sectional views of gate turn-off thyristors constructed in accordance with the prior art.

FIG. 1 illustrates a power gate turn-off thyristor 11 as a four-layer silicon pnpn switch with an interdigitated structure of the type described, for example, in U.S. Pat. No. 3,609,476 to H. F. Storm. In the device illustrated, the outer semiconductor layers on which the cathode contact stripes or electrodes 12 and the anode contact 13 are respectively deposited are known as the n2-emitter layer and the p1-emitter layer, while the inner semiconductor layers are known as the p2-base layer and the n1-base layer. The gate contact stripes or electrodes 14 are deposited on the p2-base layer at either side of the emitter stripes and are interdigitated with the cathode contact stripes or electrodes 12.

Briefly, the distinctive features of the turn-off mechanism in the GTO device include the interruption of anode current flowing from the anode terminal A to the cathode terminal C upon application of a reverse gate pulse applied to the gate terminal G. The main effect, as described previously, is the squeezing or densification of current near the center of the n2-emitter due to the lateral voltage drop in the p2-base which is caused by the reverse gate current $-i_G$ being withdrawn from the gate terminal.

The regions immediately adjacent to the gate contacts 14 are the first to become nonconducting, and as the current is squeezed toward the center of the emitter, turn-off begins at the edge of the emitter and proceeds inwardly as the current density increases at, or near, the center of the emitter. When the conducting region is squeezed to a sufficiently small enough dimension, the device turns off in a one-dimensional manner as the regenerative processes are interrupted. As pointed out above, the sharp increase in current density during turn-off may subject the device to second breakdown and cause a failure in the device by either excessive heat generation or by avalanche injection effects.

Figure 2:
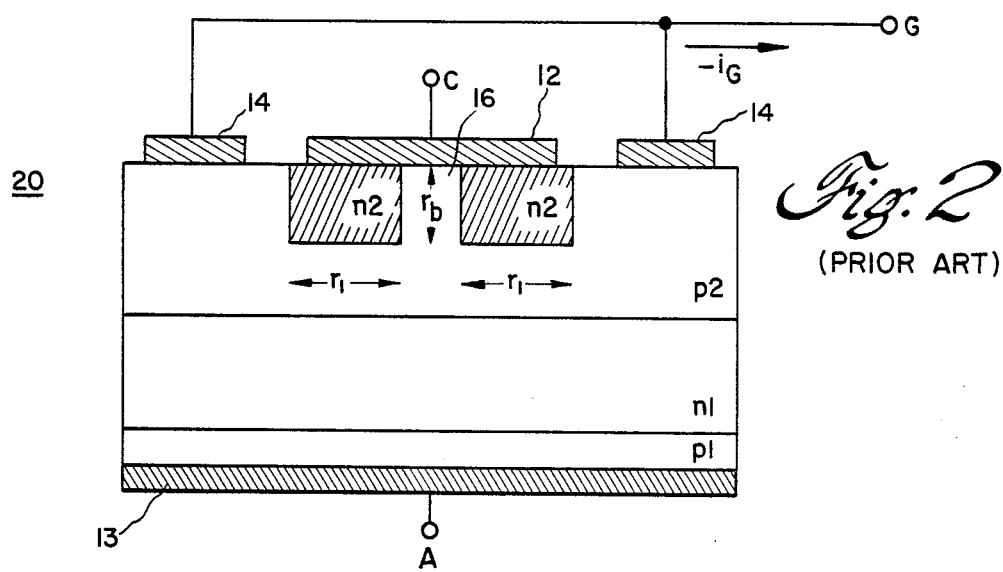

In order to decrease the magnitude of current density at the center of the emitter, FIG. 2 illustrates another GTO structure 20 constructed in accordance with the prior art in which cathode-gate shorts are employed. More specifically, FIG. 2 illustrates a region 16 centrally located within the n2-emitter region where the cathode stripe, or electrode 12 is permitted to directly contact the p2-base layer of the device. By providing a direct electrical connection (a short or shunt) between the cathode stripe 12 and the p2-base region within the central portion of the emitter region, the current densification at the center of the cathode is substantially reduced during turn-off time. This is because the current in region 16 is gate current, not cathode current, and gate current is generally a small fraction of cathode current. Such a reduction in current densification enhances the di/dt capability as well as the turn-off time. Additionally, the dV/dt capability of the device is increased as well as the threshold for failure of the device due to current densification at the center of the emitter. Unfortunately, the resistance $r_b$ in the shorted emitter region is less than the lateral resistance $r_1$ under the cathode stripe and hence a steady-state current will flow from cathode to gate during the reverse biased "OFF" period. This current may be a significant fraction of the ON current and represents a power loss and undesirable generation in the device.

Figure 3:
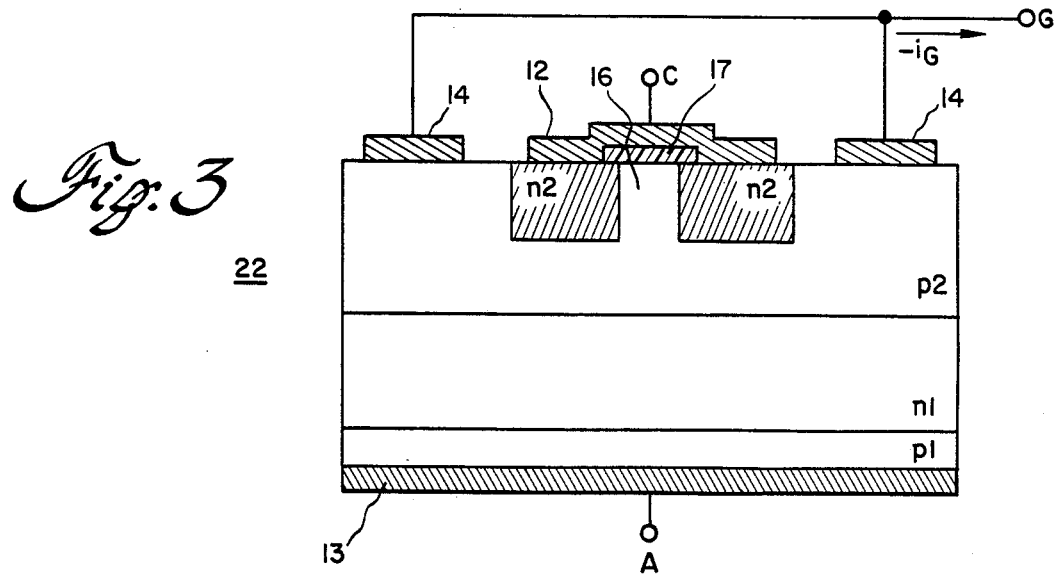
FIG. 3 is a diagrammatic, cross-sectional view of a gate turn-off thyristor constructed in accordance with a preferred embodiment of the present invention.

FIG. 3 illustrates a sectional view of a preferred embodiment of the present invention in which the electrical short between cathode and gate of the device illustrated in FIG. 2 is replaced with an electrically-insulating layer of silicon dioxide, for example, to provide a high impedance to current flow. More specifically FIG. 3 illustrates a gate turn-off thyristor 22 including an insulating layer 17 overlying the central portion 16 of the p2-base region extending to the surface of the semiconductor device. The overlying cathode stripe 12 is thereby prevented from making electrical contact with the p2 base region and hence eliminates the cathode-gate short. The thickness of the insulating layer 17 is not critical, and may vary from approximately 500 to 10,000 Angstroms.

Operationally, the gate turn-off thyristor device illustrated in FIG. 3 reduces current densification at the central portion of the emitter region during turn-off by providing a high impedance to current flow at the central portion 16 of the emitter. As a result, there is a corresponding reduction in the turn-off time and a substantial improvement in reliability due to the reduction in device failure resulting from second breakdown effects. A particularly significant feature of the GTO structure constructed in accordance with the instant invention is the elimination of current flow from cathode to gate during the reverse biased OFF period of the device. Those skilled in the art can readily appreciate that the insulating layer 17, in combination with the central region 16 of greater resistivity than that of the n2-emitter region, prevents any substantial currents from flowing between the cathode and gate regions but for that which may flow as a leakage current. In essence, therefore, the embodiment of the invention illustrated in FIG. 3 provides all the desirable characteristics of the prior art device illustrated in FIG. 2 and additionally eliminates current drain from cathode to gate during the reverse biased OFF period.

Figure 4:
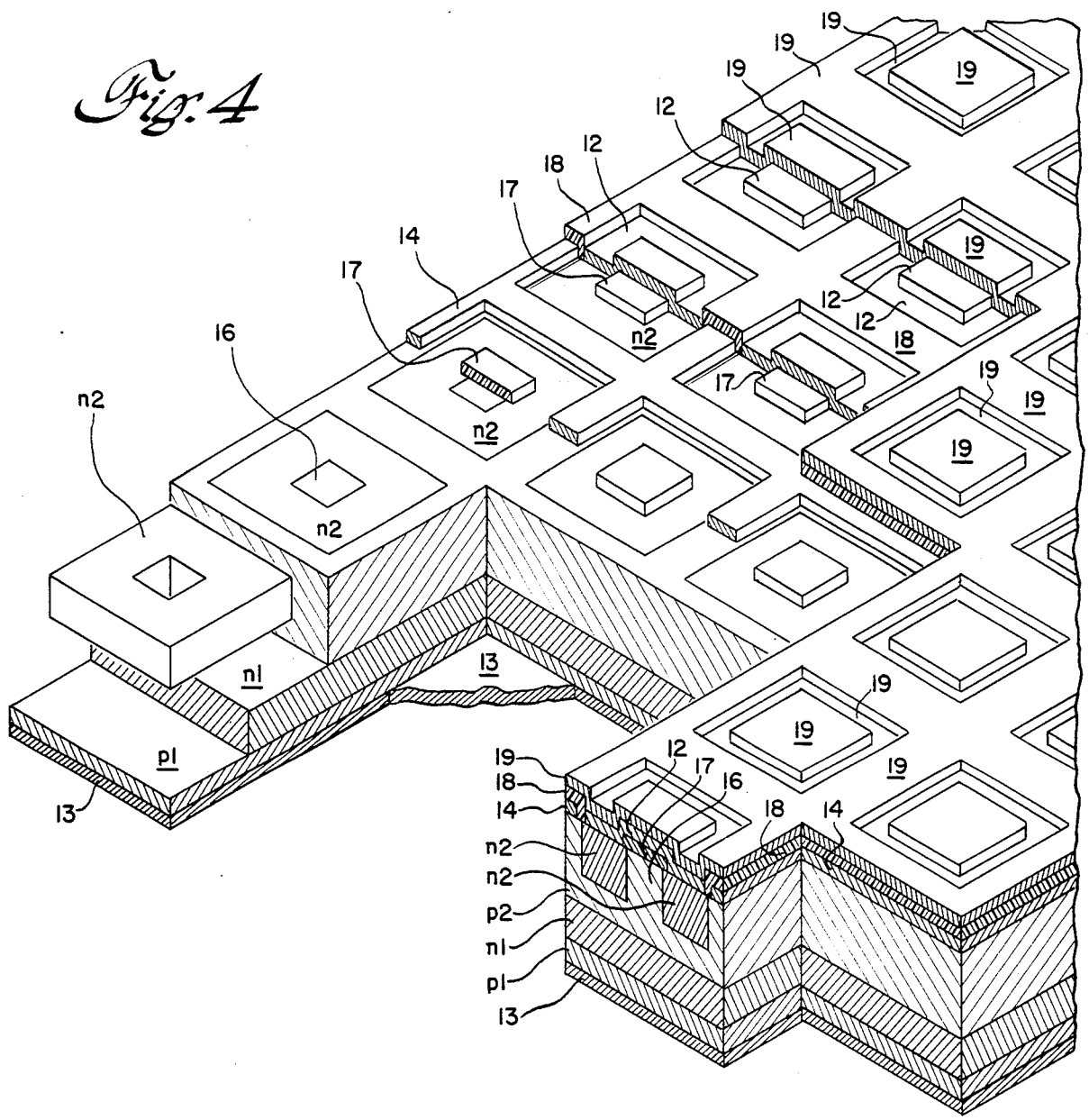
FIG. 4 is a partial perspective view of a preferred embodiment of the present invention.

Whereas FIG. 3 illustrates a single emitter region interdigitated with adjacent gate regions, it can be appreciated by those skilled in the art that, in order to achieve high currents (i.e., tens to hundreds amperes), it is desirable to provide a plurality of interdigitated gate and emitter regions. However, in doing so, it is necessary that the current flow between anode and cathode be substantially uniformly distributed across the cathode surface of the device. FIG. 4 illustrates by way of example, another embodiment of the invention in which a plurality of cellular regions, similar to those illustrated in FIG. 3, are placed adjacent to each other such that a multicellular design with uniform turn-on and turn-off characteristics is provided. In particular, FIG. 4 illustrates a plurality of n2-emitter regions of generally rectangular configuration, formed in the p2-base region, by well-known diffusion processes, for example, FIG. 4 also illustrates the interconnecting grid stripes or contacts 12 which form a mesh covering a significant fraction of the total surface area of the device. As a result, the cathode displacement current is quite small and can be carried by the gate stripes thereby enhancing the dV/dt capability of the device. FIG. 4 also illustrates more clearly the inner regions 16 of the n2-emitter regions where current is not permitted to flow because of the insulating regions 17 and the regions 16 of greater resistivity than that of the n2-emitter regions. Hence, as pointed out above current densification is substantially reduced, thereby reducing turn-on time and failure due to effects of second breakdown.

It should be appreciated by those skilled in the art that although the embodiments of the invention illustrated in FIGS. 3 and 4 depict the n2-emitter region as being of generally rectangular shape with an unmodified p2-base region extending centrally to the surface of the semiconductor wafer, other structural configurations may be utilized without departing from the spirit and scope of the invention. For example, circular and involute shaped interdigitated emitter and gate regions with the emitter region having a central region of greater resistivity than that of the surrounding n2-emitter region, or of conductivity type similar to the base region, may be employed, if desired.

FIG. 4 additionally illustrates the metallic interconnection at the surface of the plurality of n2-emitter regions by a common cathode metalization 19. It should be noted that an insulating layer 18 is interposed between the grid stripes 14 and the common cathode metalization 19 to prevent electrical shorts. Those skilled in the art can readily appreciate that such an arrangement of conductors insulatingly overlying each other permits uniform heat removal from the top as well as the bottom surface of the semiconductor wafer, an essential requirement for high power semiconductor switches.

Whereas the foregoing description of the preferred embodiments of the invention have been directed to insulated gate turn-off thyristors, it can be readily appreciated by those skilled in the art that the novel features of the instant invention are applicable to bipolar transistors as well. For example, the thyristors of FIGS. 3 and 4 can easily be converted to bipolar transistors by changing the p1-emitter layers which function as the anodes for the thyristors to n+ layers and the device then becomes a bipolar npn transistor. In this configuration, the n1-base layer becomes the collector region, the p2-base layer becomes the base region, and the n2-emitter layer becomes the emitter region of the bipolar transistor.

A bipolar transistor constructed in the manner similar to that illustrated in FIG. 4 therefore exhibits substantially the same desirable characteristics as the gate turn-off thyristor; namely, there is a reduction in emitter current densification during turn-off, a high threshold for failure due to second breakdown either by avalanche injection or heat generation, no sacrifice in current gain and no additional current dissipation in the base drive circuit.

Figure 5A:
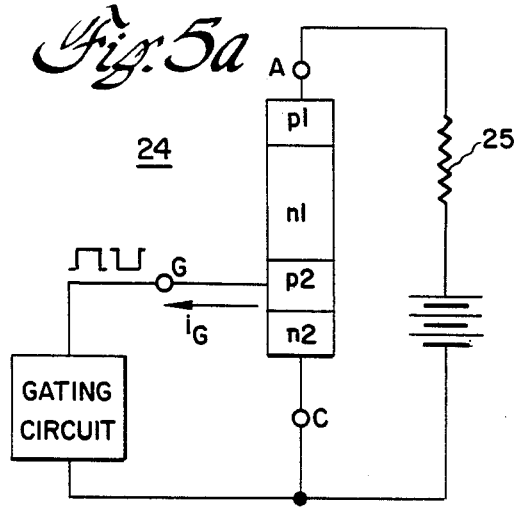
FIGS. 5a and 5b are schematic diagrams of electrical circuits illustrating the use of a gate turn-off thyristor and a bipolar transistor, respectively.
Figure 5B:
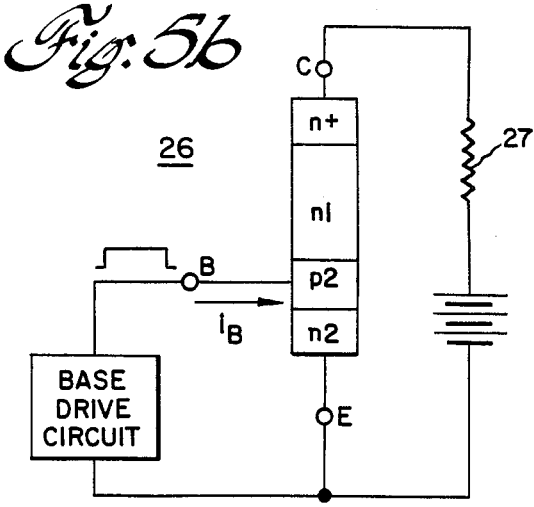

FIGS. 5(a) illustrates a typical schematic diagram of a pnpn gate turn-off thrystor connected in an electrical circuit 24 for controlling current flow through a load element 25 and FIG. 5(b) illustrates a schematic diagram of an npn transistor connected in an electrical circuit 26 for controlling current flow through a load element 27. It should be apparent to those skilled in the art that the illustrations of FIGS. 5(a) and 5(b) are merely by way of example of the utility of insulated gate turn-off thyristors and insulated base bipolar transistors and that various other uses are possible. Furthermore, whereas the embodiments of the invention illustrated have been with respect to a pnpn semiconductor configuration, npnp configurations are possible. Similarly, in addition to silicon, other semiconductor materials, such as germanium or Group III–V semiconductor compounds may also be employed where desired. Additionally, a complementary structure to the npn insulated base bipolar transistor is also envisioned.

In summary, a gate turn-off thyristor and an insulated base bipolar transistor are described which exhibit superior performance characteristics to well-known prior art thyristors and bipolar transistors. Particularly, current densification and turn-off time are substantially reduced thereby eliminating undesirable reverse bias currents, considerably increasing di/dt and dV/dt capabilities, as well as increasing the threshold to failure due to second breakdown.

While the invention has been particularly shown and described with reference to several described embodiments thereof, it will be understood by those skilled in the art that numerous changes and modifications may be made without departing from the spirit and scope of the invention.

What is claimed is:

1. In a bipolar transistor semiconductor device having an emitter terminal and a collector terminal, and a base terminal for controlling current flow through said collector and emitter terminals, and wherein said device includes a semiconductor wafer having three regions of alternating conductivity type overlying each other, the inner region comprising the base region and the outer regions comprising the emitter and collector regions of said device, the emitter region including a plurality of individual cellular regions, the improvement comprising:

a plurality of adjacently spaced regions of predetermined resistivity extending from said base region substantially centrally into each of said cellular regions, respectively, each of said regions of predetermined resistivity being of higher resistivity than its respective surrounding cellular region, each of said cellular regions extending into said base region from a common surface thereof so as to be completely surrounded by said base region;

a base electrode situated atop said base region and surrounding each of said cellular regions;

an insulating layer overlying each said region of predetermined resistivity, respectively, for precluding any significant current flow from said base to said cellular regions during the nonconducting state of said device; and conductive means electrically interconnecting said cellular regions.

* * * * *